US007164568B2

(12) United States Patent
Walters

(10) Patent No.: US 7,164,568 B2
(45) Date of Patent: Jan. 16, 2007

(54) BI-DIRECTIONAL PIN OR NIP LOW CAPACITANCE TRANSIENT VOLTAGE SUPPRESSORS AND STEERING DIODES

(75) Inventor: Cecil Kent Walters, Scottsdale, AZ (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 11/071,513

(22) Filed: Mar. 3, 2005

(65) Prior Publication Data

US 2005/0190523 A1 Sep. 1, 2005

Related U.S. Application Data

(62) Division of application No. 10/788,536, filed on Feb. 27, 2004.

(51) Int. Cl.
*H02H 3/22* (2006.01)

(52) U.S. Cl. .......................... 361/111; 363/20; 257/656

(58) Field of Classification Search ................ 361/111, 361/119; 363/20; 257/656
See application file for complete search history.

*Primary Examiner*—Douglas W. Owens
(74) *Attorney, Agent, or Firm*—Jackson Walker LLP; Robert C. Klinger

(57) ABSTRACT

A bi-directional low capacitance TVS using a PIN or NIP diode is disclosed. Bi-directional low capacitance TVS protection circuit (1000) consists of two pairs of TVS diodes (1001), (1003) and LC PIN or NIP diodes (1002), (1004). Diodes (1003) and (1004) are in parallel and in opposite direction from a first series of TVS and LC diode pair. This circuit provides transient protection in both directions for a bi-directional low capacitance TVS.

24 Claims, 5 Drawing Sheets

BI-DIRECTIONAL PIN OR NIP LOW CAPACITANCE TRANSIENT VOLTAGE SUPPRESSORS AND STEERING DIODES

CROSS REFERENCE TO RELATED APPLICATIONS; CLAIMS OF PRIORITY

This application is a divisional of U.S. patent application Ser. No. 10/788,536, filed Feb. 27, 2004 entitled "PIN or NIP Low Capacitance Transient Voltage Suppressors and Steering Diodes", the entire contents of which are incorporated herein by this reference. The Applicant hereby claim the benefits of this pending patent application under 35 U.S.C. Section 119(e).

FIELD OF THE INVENTION

The present invention relates to low capacitance transient voltage suppressors ("TVSs") or steering diodes used for protecting high frequency signal channels, including telecommunication lines, wireless communications, and high baud-rate lines.

BACKGROUND OF THE INVENTION

For optimum transient protection of sensitive devices that operate at high frequencies, low capacitance rectifiers or signal diodes are needed. Lower capacitance values are required to minimize or eliminate signal distortion at higher frequencies. However, conventional low-capacitance rectifiers or signal diodes are limited in their ability to provide lower capacitance values without also significantly increasing their clamping voltage ($V_C$). To adequately protect sensitive components, lower clamping voltages are needed where high-current transients may occur. Due to advances in semiconductor technology using smaller feature sizes in integrated circuits, the threshold-to-failure levels in voltage for components are becoming lower when subjected to high transient voltages. Consequently, newer generation integrated circuits ("ICs") and CMOS devices are more vulnerable to transients, including electrostatic discharge ("ESD"). Conventional low capacitance rectifiers or signal diodes do not provide both low capacitance values and low clamping voltages. Conventional low-capacitance rectifiers or signal diodes in series with a TVS element or as individual steering diodes have disadvantages when used in telecommunications and other applications that operate at higher frequencies using sensitive ICs or CMOS components requiring lower voltage levels.

SUMMARY OF THE INVENTION

The present invention comprises a circuit arrangement using PIN or NIP diodes for improving the capacitance and clamping voltage performance of conventional low capacitance TVS or steering diodes. The present invention can be implemented in a variety of low capacitance TVSs or steering diodes used for, among other things, protecting higher frequency signal, telecommunication lines and/or wireless communications, or any other high frequency channel or baud-rate line requiring transient protection. The present invention can also be implemented in next generation multimedia systems or network applications and system designs requiring lower capacitance as well as lower clamping voltage performance from conventional TVS or steering diodes. The present invention reduces both capacitance and clamping voltage for transient voltage suppressors or steering diodes used for protecting other sensitive-circuit components. The low capacitance features of the present invention are less sensitive to standby voltages in TVS applications when protecting very high frequency signal lines. The need for lower capacitance values is particularly important for applications operating at higher frequencies or baud rates. Lower clamping voltages are important for protecting components from ESD transients, particularly if the components have low threshold-to-failure voltage levels such as newer generation ICs with smaller features or thinner gates.

While the making and using of various embodiments of this invention are discussed in detail herein, it should be appreciated this new invention provides many applicable inventive concepts that can be embodied in a wide variety of specific contexts. This invention is applicable to methods of design in low capacitance transient voltage suppressors also known as low capacitance avalanche breakdown diodes ("ABDs") in various international markets. The present invention further comprises improvements for steering diodes used for various low-voltage forms of transient voltage suppression.

DESCRIPTION OF THE DRAWINGS

The features of the present invention will be more clearly understood from consideration of the following descriptions in connection with accompanying drawings in which.

DETAILED DESCRIPTION OF ILLUSTRATIVE EMBODIMENTS

The present invention comprises a circuit arrangement and method of transient voltage protection using PIN or NIP diodes, the circuit arrangement and method having lower capacitance values and lower clamping voltages when compared with conventional transient voltage protection schemes. The present invention is particularly well adapted for applications operating at higher frequencies and/or for protecting sensitive components with lower threshold-to-failure levels. The present invention provides minimal capacitance variation with applied voltages thus improving performance at higher frequencies without signal distortion, making it easier to provide impedance matching in a circuit.

Figure 1A:
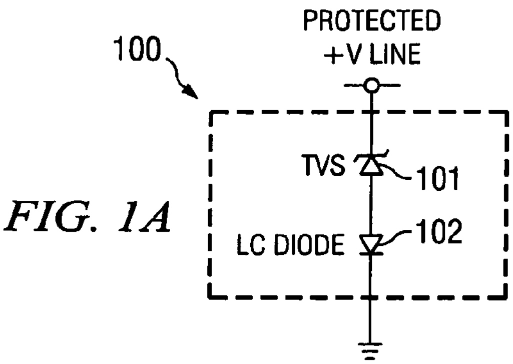
FIG. 1A is a schematic of the conventional unidirectional blocking low capacitance TVS.
Figure 1B:
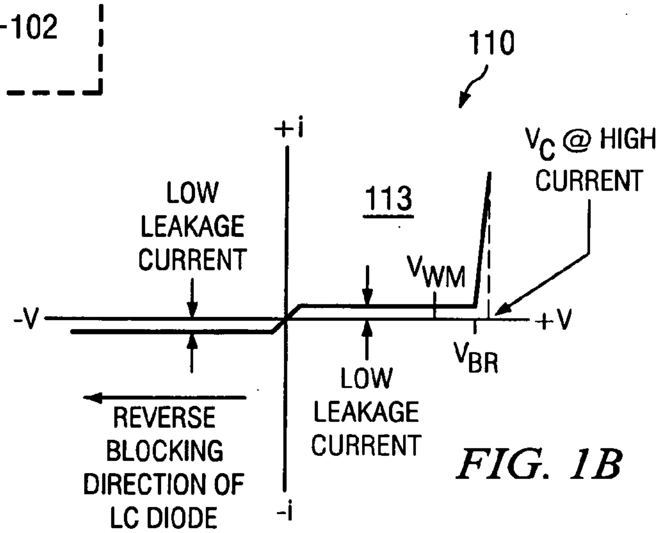
FIG. 1B is a plot of the voltage-current characteristics of the device of FIG. 1A.

Referring now to the Figures, there is shown in FIG. 1A a basic unidirectional blocking low capacitance TVS diode circuit, and in FIG. 1B, a plot 110 of the voltage-current characteristic for the low capacitance TVS of FIG. 1A. A conventional arrangement of components comprising a unidirectional low capacitance TVS component 100 is shown within the dashed outline area of FIG. 1A. As seen therein, a TVS p-n junction diode element 101 and low-capacitance ("LC") diode p-n junction element 102 are placed in series and with opposite polarity for unidirectional protection. The unidirectional low capacitance TVS component 100 is a two (2) terminal device that has at least one unidirectional TVS element 101 and one series rectifier blocking p-n junction, or LC diode 102, in opposite polarity for reducing capacitance in one direction only. Disadvantageously, the low capacitance TVS 100 is intended for transients in only one direction. The smaller, low capacitance p-n junction or LC diode 102 blocks in its opposite direction, similar to a rectifier, and is not intended to be operated in its reverse avalanche breakdown region. The larger p-n junction diode that serves as the unidirectional TVS element 101 determines anode and cathode polarity, whereas the LC diode 102 is ignored for device polarity. During normal operation, the unidirectional low capacitance TVS component 100 has a working peak voltage ($V_{WM}$) that is less than the avalanche breakdown voltage ($V_{BR}$) of the TVS element 101 where very little reverse current flows. As a result, the LC diode 102 is typically operating with virtually zero voltage across it since the reverse biased TVS element 101 blocks current flow and absorbs all the applied voltage. During this standby mode of operation, the TVS should ideally behave in a transparent manner to the circuit or line that it is protecting until a transient occurs. This ideal transparent operation minimizes or eliminates any other influence or parasitic added effects on the circuit from line to ground until a transient occurs.

When a transient over-voltage event occurs, the TVS p-n junction 101 is rapidly driven into its initial breakdown voltage mode where it clamps the high voltage to a level identified as the clamping voltage ($V_C$). This $V_C$ value at high current is greater than the $V_{BR}$ value where the amount of increase should ideally be minimized as shown in quadrant one (1) 113 of the plot of FIG. 1B, and the blocking direction in quadrant three (3). The increase in voltage during the clamping of a high-current transient in quadrant one (1) is due to the resistance of the TVS p-n junction as well as its positive temperature coefficient of $V_{BR}$ and heating effects from absorbed energy during the transient. However some additional portion of voltage is also based on the LC diode when it is forward biased into its conduction mode during the transient event. Voltage from the LC diode is minimized by the present invention. In addition, the present invention operates to lower the capacitance of the LC diode.

During the transient event, high-current is diverted to ground through both the TVS element 101 and LC diode 102 combination before damage occurs to sensitive components downstream. Conventionally, the LC diode 102 is simply a p-n junction rectifier with a desired capacitance value, or a signal or switching diode with sufficiently low capacitance for the desired application. This series combination reduces the much higher capacitance effects of the TVS element 101 when used alone.

TVS elements with comparatively large p-n junction sizes and capacitance values are well known for absorbing most of the energy or peak pulse power ($P_{PP}$) in this series combination. It is also well know that placing capacitors in series will reduce the total capacitance ($C_T$) to a value at or below the value of the lowest capacitor. This may be mathematically shown as:

$$1/C_T=1/C_1+1/C_2+1/C_3+\text{up to } 1/C_N$$

where $C_1$, $C_2$, $C_3$ up to $C_N$ are capacitance elements in series up to the number N. If there are only two capacitor elements in series ($C_1$ and $C_2$), the total capacitance in the above equation simplifies to:

$$C_T=C_1C_2/(C_1+C_2)$$

Figure 2A:
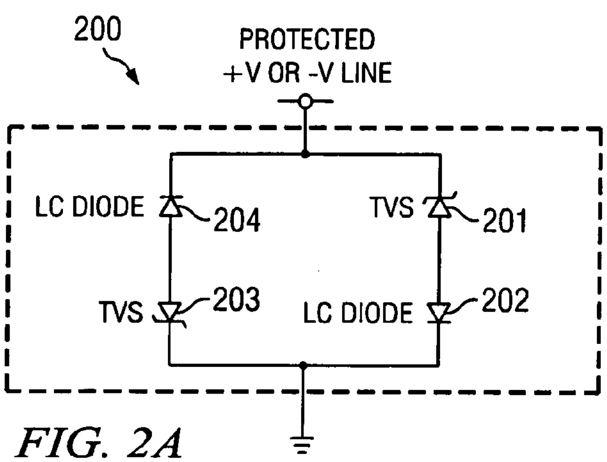
FIG. 2A is a schematic of the conventional bi-directional low capacitance TVS.
Figure 2B:
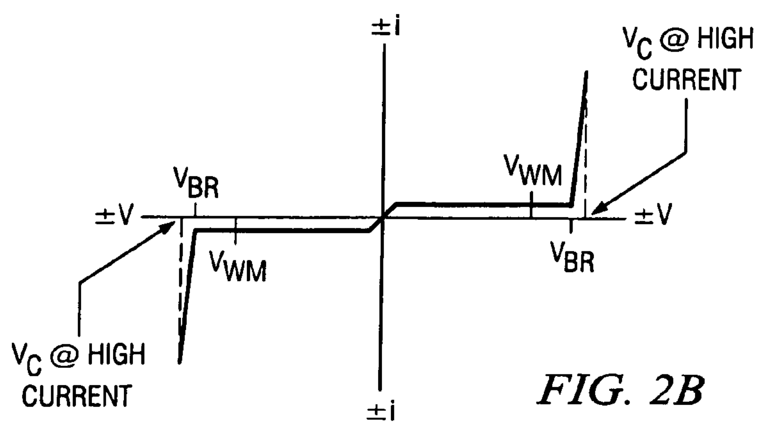
FIG. 2B is a plot of the voltage-current characteristics of the device in FIG. 2A.

Referring now to FIG. 2A, there is shown a second conventional TVS circuit 200. Bi-directional low capacitance TVS protection circuit 200 consists of two pairs of TVS diodes 201, 203 and LC diodes 202, 204. Diodes 203 and 204 are in parallel and in opposite direction from the first series of TVS and LC diode pair shown in FIG. 1A. In the configuration shown in FIG. 2A, the capacitance is twice that shown in FIG. 1A. This circuit provides the same transient protection as the conventional circuit of FIG. 1A, but in both directions for a bi-directional low capacitance TVS. FIG. 2B shows a plot of the voltage-current characteristics of the circuit of FIG. 2A. The device of FIG. 2A is a two (2) terminal device that has two parallel unidirectional low capacitance TVS devices facing opposite directions, also known as an anti-parallel configuration. If each opposing leg in FIG. 2A were identical to FIG. 1A, this bi-directional configuration would be twice the capacitance of FIG. 1A. In operation, the low capacitance p-n junction rectifier LC diodes 202, 204 must have a reverse blocking voltage greater than the avalanche breakdown voltage ($V_{(BR)}$) of the anti-parallel unidirectional TVS elements comprised of 201 and 203.

Figure 3A:
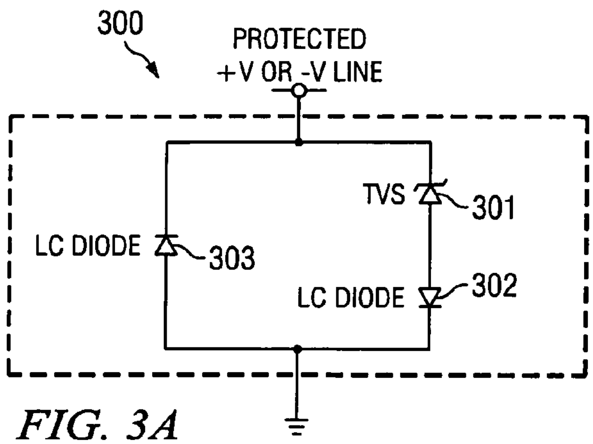
FIG. 3A is a schematic of the conventional unidirectional conducting low capacitance TVS.
Figure 3B:
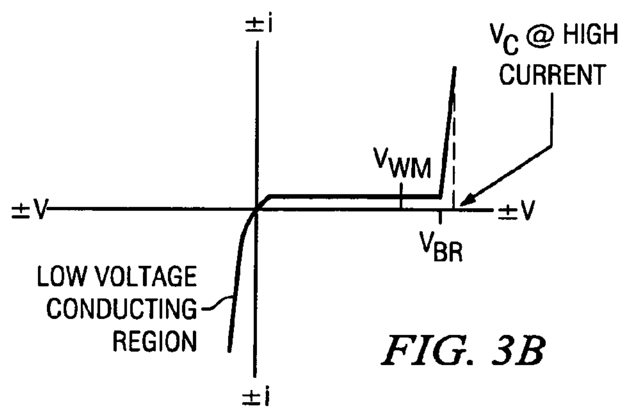
FIG. 3B is a plot of the voltage-current characteristics of the device of FIG. 3A.

FIG. 3A illustrates a third conventional TVS circuit 300 adapted to provide unidirectional conducting, low capacitance protection. Circuit 300 comprises an LC diode 303 in parallel to the TVS diode 301 and LC diode 302, and opposite direction of the LC diode 302. This configuration provides a low-voltage, conduction path in one direction in parallel with a low-capacitance diode and unidirectional TVS protection as seen in FIG. 1A. The circuit of FIG. 3A, discloses a two (2) terminal device with a unidirectional low capacitance TVS diode 301 as described in FIG. 1A and an anti-parallel LC diode 302. To provide for a low capacitance TVS with a forward conducting low-voltage characteristic, a LC diode, such as a rectifier, is placed in anti-parallel to the unidirectional low capacitance TVS. This LC diode must also have a reverse blocking voltage greater than the avalanche breakdown p-n junction voltage ($V_{(BR)}$) of the unidirectional TVS. FIG. 3B shows a plot of the voltage-current characteristics of the circuit in FIG. 3A, where the low-voltage conducting region is in quadrant three (3) and the higher voltage TVS clamping is in quadrant one (1).

The conventional circuits of FIGS. 1A, 2A, and 3A are typically used in TVS applications requiring low capacitance that are intended to divert higher voltage transients from line to ground. The positive voltage (+v) and negative voltage (−v) as well as corresponding current flow in FIGS. 1B, 2B, and 3B is relative to protecting a positive or negative line with respect to ground in these figures.

Figure 4A:
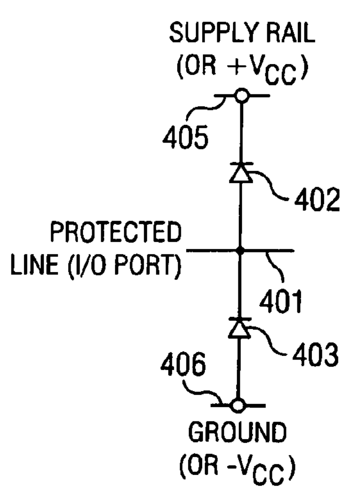
FIG. 4A is a schematic of a pair of conventional low capacitance steering diodes from a protected line (or I/O port) to $+V_{CC}$.
Figure 4B:
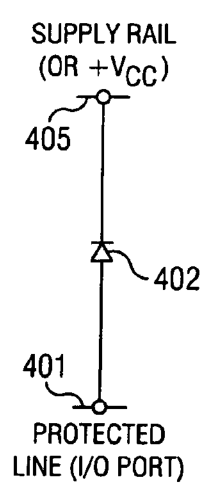
FIG. 4B is a schematic of a conventional low capacitance steering diode from a protected line (or I/O port) to $+V_{CC}$.
Figure 4C:
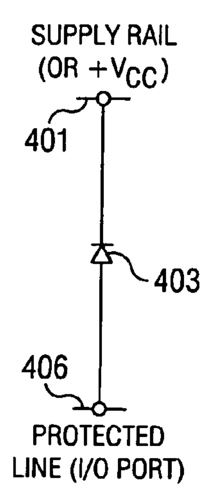
FIG. 4C is a schematic of a conventional low capacitance steering diode from a protected line (or I/O port) to ground.

FIGS. 4A, 4B, and 4C illustrate a conventional low capacitance diode arrangement configured as steering diodes to protect a signal line or input/output (I/O) port 401 from high voltage transients by diverting or directing the transient to either the positive side of the power supply line or to ground. In these examples, the p-n junction steering diodes 402, 403 are used for their low voltage characteristics in the forward conducting region to clamp any high-voltage transients of either polarity. Depending on the polarity of the high-voltage transient, the current would be diverted to a lower voltage reference point such as ground or to the positive power supply line. Low capacitance values of diodes 402, 403 minimize parasitic losses or signal-line distortion in this type of application. More specifically, the two steering diodes 402, 403 in FIG. 4A protect input/output line (I/O port) 401 by diverting positive or negative voltage transients to either supply rail ($V_{CC}$) 405 or to ground or another negative supply rail ($-V_{CC}$) 406. Diodes 402, 403 may be provided individually in FIGS. 4B and 4C where each have two terminals, or as diode pairs as seen in FIG. 4A with three terminals. This arrangement can also be provided in more complex steering diode arrays as shown in FIG. 6.

Figure 5:
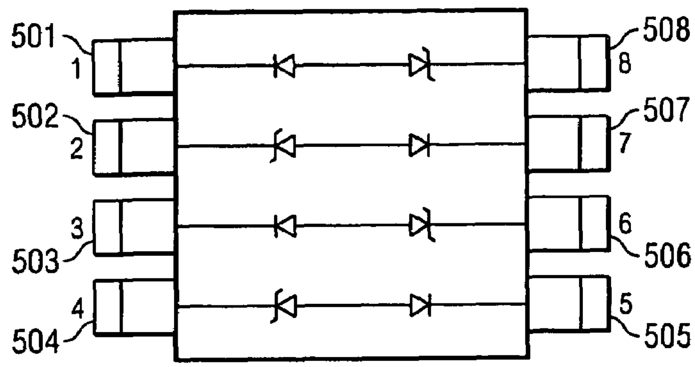
FIG. 5 illustrates a low capacitance TVS array.

The TVS protection circuits of FIGS. 1A, 2A, 3A, 4A, 4B, and 4C serve to protect sensitive components that are located downstream in the circuit. The present invention comprises a circuit and method for reducing the capacitance and voltage of the LC diodes shown in the circuits of FIGS. 1A, 2A, 3A, 4A, 4B, and 4C in applications for diverting high-voltage transients to ground or to other reference points such as the positive or negative side of a power-supply line. The present invention can also be applied to any other diode array configuration that uses multiple diode-leg combinations comprised of TVS and (or) LC diode elements similar to those described in FIGS. 1A, 2A, 3A, 4A, 4B, and 4C. TVS arrays are three (3) or more terminal devices containing multiple diodes within a single package where at least one of the diodes is a TVS as shown in FIGS. 1A, 2A, and 3A. Similarly steering diode arrays are three (3) or more terminal devices containing multiple diodes within a single package. Although this invention may be applied to all such TVS arrays as well as steering diode arrays (without one or more TVS elements), two examples of these diode arrays are shown in FIGS. 5 and 6. FIG. 5 is a specific TVS array example and FIG. 6 is a specific steering diode array example.

FIG. 5 illustrates a low capacitance TVS array 500. The device of FIG. 5 comprises an eight (8) terminal device having an array of four (4) unidirectional legs of low capacitance TVS components where each leg is similar to the unidirectional low capacitance TVS seen in FIG. 1A. Each alternate leg is facing the opposite direction from its neighbor so it can also be used as a bi-directional low capacitance TVS. Terminals 501 and 502 are coupled together for one common terminal and, terminals 507 and 508 are coupled together for an opposite terminal as seen in FIG. 2A. A similar arrangement of connections can be applied to terminals 503 and 504 as well as terminals 505 and 506 for achieving two separate bi-directional low capacitance TVS configurations. Such a TVS array could be packaged into a SOIC-8 as well as an 8 pin dual-in-line package for example. TVS arrays may be provided with multiple discrete semiconductor chips or multiple diode junctions diffused into a single semiconductor chip or monolithic structure.

Figure 6:
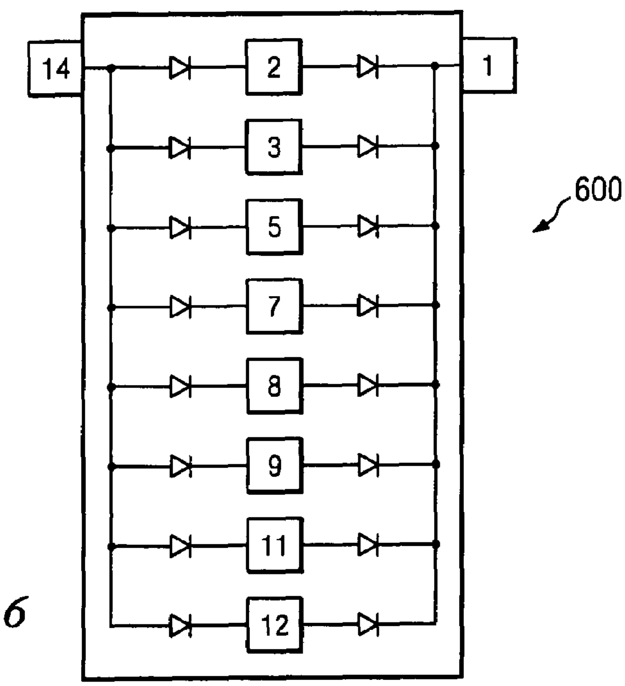
FIG. 6 illustrates a low capacitance steering diode array.

Referring to FIG. 6, a low capacitance steering diode array device is illustrated. Low capacitance steering diode arrays comprise three (3) or more terminal devices containing multiple diodes within a single package. The device of FIG. 6 has eight (8) legs of steering diodes where each leg is similar to the device of FIG. 4, provided in a much larger array. For example in the first leg, pin 14 would be connected to ground, pin 2 to the protected line or I/O port, and pin 1 to the supply rail or $+V_{CC}$. Pins 3, 4, 5, 7, 8, 9, 11, and 12 would be connected to other protected lines or I/O ports. The device of FIG. 6 has 14 terminals that could be in a SOIC-14 or 14 pin dual-in-line package for example. Steering diode arrays can be provided with multiple discrete semiconductor chips or multiple diode junctions diffused into a single semiconductor chip or monolithic structure.

In each of the conventional devices and arrangements of FIGS. 1A, 2A, 3A, 4A, 4B, 4C, 5 and 6, there is desired the ability to lower both the capacitance and clamping voltage of the LC diodes used therein, while minimizing capacitance variations with applied reverse voltage across the LC diode elements. It is well known the capacitance of p-n junction diodes at zero applied voltage is primarily influenced by active p-n junction area and the resistivity of material used. The capacitance will be reduced if the active p-n junction area is decreased or resistivity of material is increased in which the p-n junction is formed. However both of these changes to reduce capacitance will also increase the voltage from the forward biased p-n junction LC diodes or rectifiers during a high-current surge thus increasing the clamping voltage. This increase in clamping voltage reduces the optimum performance of the TVS. When used in series with a TVS element, this voltage increase can become a significant portion of the total clamping voltage for lower voltage TVS designs. The present invention comprises a circuit and method using a different type of specialized diode element whereby both the capacitance and voltage levels can be reduced. Further, the present invention minimizes variations of capacitance with different applied reverse voltage levels across the LC diode in high frequency applications. The capacitance of conventional devices declines with increasing applied reverse voltage for p-n junction diodes. Capacitance variations are undesirable in these conventional low capacitance TVS devices as they can distort high frequency signals. If there is little change in capacitance versus applied reverse voltage, then it becomes much easier to provide impedance matching to minimize possible signal distortion. The present invention is advantageously adapted to provide minimal changes in capacitance versus applied reverse voltage, making it much easier to provide impedance matching and minimize possible signal distortion.

All these performance feature improvements are achieved by changing the conventional p-n or n-p diode junction structures to a more sophisticated p-i-n or n-i-p configuration where the "i" represents an intrinsic "I" region of sufficient thickness to produce the desired effects during a transient. The use of the terms "PIN" or "NIP" diodes herein and in the claims refers to any semiconductor p-i-n or n-i-p diode junction configuration with sufficient "I" region thickness to produce the effects described herein. Among other things, the scope of the present invention includes any diode device configuration with sufficient "I" region capable to produce lower voltages during transient clamping as well as lowering the capacitance under normal working voltages during its "standby" mode of operation. The use of a device with an appropriate "I" region minimizes capacitance variation with applied working voltages or signals at very high frequencies during the standby mode. These effects can also be achieved using judiciously selected PIN or NIP diodes which are conventionally available in the industry for applications involving rf switching or attenuation, in the disclosed circuits.

Figure 7:
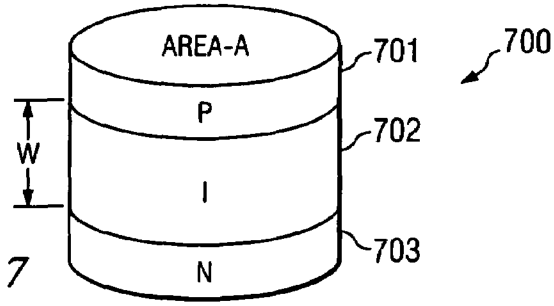
FIG. 7 illustrates a PIN diode structure.

As seen in FIG. 7, one embodiment of the present invention is implemented using an intrinsic "I" region 702 of high resistivity with a long minority-carrier lifetime that is located between a highly doped p region 701 and n region 703. FIG. 7 illustrates a PIN diode structure. The PIN diode 700 is represented by a distinct intrinsic region 702 between a p-doped region 701 and n-doped region 703 with a substantial width "W" for the intrinsic "I" region (typically 10–500 μm). The order of layering is reversed in polarity for a NIP structure. The circular-die structure of PIN diode 700 shown can be square or rectangular as well as for a NIP diode structure. These three-layer diode designs have conventionally been used as an attenuator or conducting switch for rf and microwave frequencies. As described herein, this design feature can advantageously be used in a low capacitance TVS for clamping short duration transients.

Because of the relatively thick "I" region of typically 10–500 μm and very high resistivity that typically is 250 ohm-cm or higher, these devices have lower capacitance than p-n junctions of equivalent junction area. These characteristics are similar to increasing the distance between the plates of a given size parallel-plate-capacitor to reduce capacitance. When a PIN or NIP diode is forward biased in a TVS application during a high-current surge, holes and electrons are injected from the heavily doped p-region and n-region respectively into the very lightly doped I-region. These injected charges have a high mobility in this lightly doped I-region. Because the "I" region has a very long minority-carrier lifetime (typically greater than 0.1 ms) in this high resistivity layer, these charges do not combine immediately.

When PIN and NIP diodes are used conventionally in rf frequency applications, when the rf frequency is above a level where its period is shorter than the transit time of the I-region, the I-region resistance is proportional to the square of the I-region thickness and inversely proportional to the forward current, the electron and hole mobility, and the minority-carrier lifetime. This is conventionally known as the transit-time frequency ($f_T$). Below this frequency or dc conditions, the diode behaves more like a conventional p-n junction with a higher diode resistance as described by dynamic impedance of the I-V characteristics at specific operating points. These combined effects provide a significantly reduced resistance effect when biased in the forward direction at very high frequencies above $f_T$ when using PIN and NIP diodes in conventional rf switching or attenuation applications. This unique high-frequency behavior of providing significantly reduced resistance is also observed during a short transient where much of the high-current transient has occurred before the minority carriers have recombined. This results in a lower clamping voltage when exposed to very short transients in the forward conducting direction of PIN or NIP diodes. This is also referred to in the semiconductor industry as a p-i-n or n-i-p diode structure with reference to the present invention that simply uses the terms PIN or NIP diodes. It is the use of these diode structures as low-capacitance diode elements in TVS or steering diode applications seen in FIGS. 1A, 2A, 3A, 4A, 4B, and 4C, as well as arrays similar in configuration of those of FIGS. 5 and 6 that significantly reduce clamping voltages at high surge currents of short duration. The desired low voltage transient characteristics may also be a result of a portion of the surge current crossing the I region as diffusion current rather than drift current due to high minority carrier concentration gradients during a short high-current transient before recombination occurs. This also has the effect of minimizing voltage across the I-region since the voltage is the product of only the drift current component and resistance from Ohm's Law in an electric field.

Figure 8:
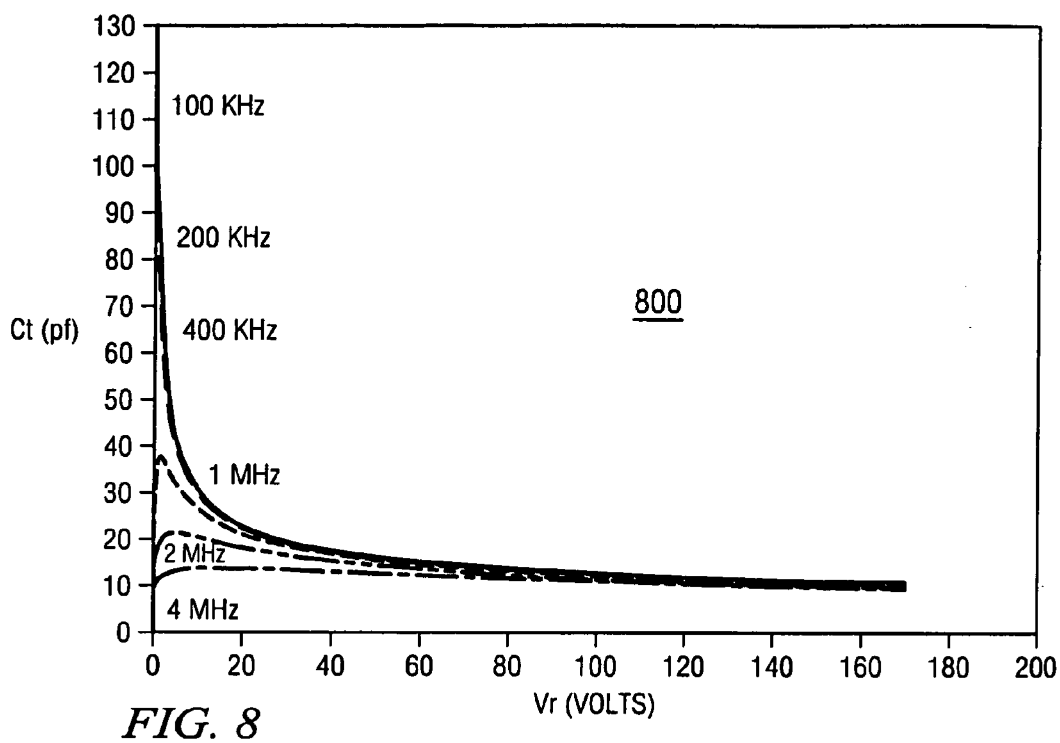
FIG. 8 illustrates the typical capacitances of PIN or NIP diodes.

As seen in FIG. 8, an additional unique feature of the p-i-n or n-i-p diode structure at high frequencies is their ability to behave as a parallel plate capacitor essentially independent of reverse voltage. This added feature of the invention is of notable advantage for low capacitance TVS or steering diode applications protecting very high frequency signal lines where the low capacitance diodes are most often operated at zero or reverse bias in their stand-by mode for applications as shown in FIGS. 1A, 2A, 3A, 4A, 4B, and 4C. This capacitance value is proportional to junction area and inversely proportional to the I-region thickness or width (seen as "W" in FIG. 7) when operated well above what is called the "dielectric relaxation frequency" for those disciplined in the design of PIN or NIP diodes for conventional rf switching or attenuation applications.

FIG. 8 is a graph illustrating the typical capacitance of a PIN or NIP diode. As seen therein, PIN or NIP diodes provide a relatively constant capacitance over a broad voltage range at high frequencies. As such, the use of one or more PIN or NIP diodes in a TVS as described herein provides low capacitance with very little change with applied reverse voltage, thus minimizing or eliminating signal distortion. In addition, the use of one or more PIN or NIP diodes in a TVS as described herein reduces the complexity of impedance matching within the application circuit design as compared to conventional TVS designs that use low capacitance diode p-n junctions. As noted, conventional TVS designs use components that vary significantly in capacitance, similar to varactor diodes, when operating at or below their working peak voltages ($V_{WM}$) in a stand-by mode with high frequency signals.

The circuit and method of the present invention provides a means to significantly lower capacitance and clamping voltage of existing TVS designs resulting in a more efficient performance. In addition to improving or lowering clamping voltage performance of existing low capacitance TVS designs in the 1 pF to 100 pF range or higher, the present invention also provides the ability of diode elements to achieve still lower capacitance values in the region of 1 pF or less. In applications that require very low capacitance values, for example, below the one (1) picoFarad level, the use of the present invention coupled with electromechanical packaging designs that are optimized to minimize parasitic packaging capacitance, can result in extremely low capacitance values.

Figure 9:
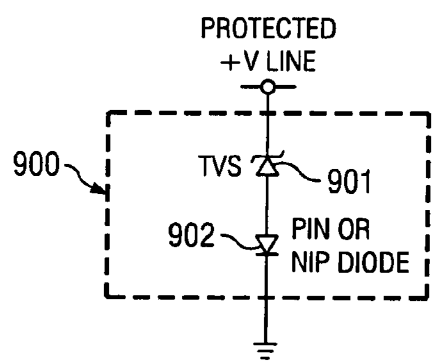
FIG. 9 is a schematic of the unidirectional blocking low capacitance TVS using a PIN or NIP diode.

FIG. 9, being a first embodiment of the present invention, is a schematic of a unidirectional blocking low capacitance TVS using a PIN or NIP diode. As seen therein, a TVS p-n junction diode element 901 and low-capacitance ("LC") diode PIN or NIP junction element 902 are placed in series and with opposite polarity for unidirectional protection. The unidirectional low capacitance TVS component 900 is a two (2) terminal device that has at least one unidirectional TVS element 901 and one series blocking PIN or NIP junction diode 902, in opposite polarity for reducing capacitance in one direction only.

Figure 10:
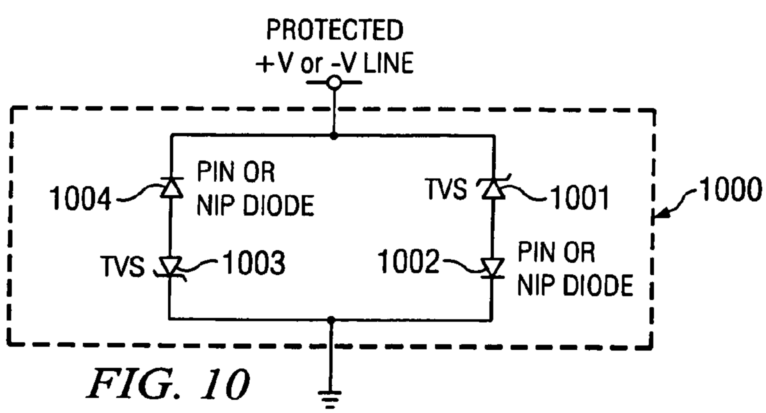
FIG. 10 is a schematic of the bi-directional low capacitance TVS using a PIN or NIP diode.

FIG. 10, being a second embodiment of the present invention, is a schematic of the bi-directional low capacitance TVS using a PIN or NIP diode. Bi-directional low capacitance TVS protection circuit 1000 consists of two pairs of TVS diodes 1001, 1003 and LC PIN or NIP diodes 1002, 1004. Diodes 1003 and 1004 are in parallel and in opposite direction from the first series of TVS and LC diode pair shown in FIG. 9. In the configuration shown in FIG. 10, the capacitance is twice that shown in FIG. 9. This circuit provides the same transient protection as the first embodiment of FIG. 9, but in both directions for a bi-directional low capacitance TVS.

Figure 11:
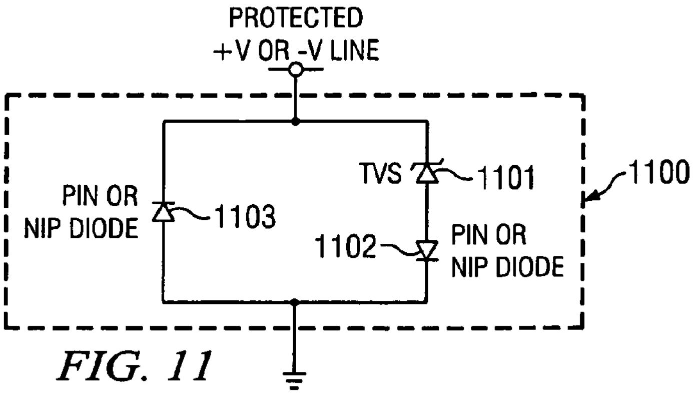
FIG. 11 is a schematic of the unidirectional conducting low capacitance TVS using a PIN or NIP diode.

FIG. 11, being a third embodiment of the present invention, is a schematic of the unidirectional conducting low capacitance TVS using a PIN or NIP diode. TVS circuit 1100 is adapted to provide unidirectional conducting, low capacitance protection. Circuit 1100 comprises an LC PIN or NIP diode 1103 in parallel to the TVS diode 1101 and LC PIN or NIP diode 1102, and opposite direction of the LC PIN or NIP diode 1102. This configuration provides a low-voltage, conduction path in one direction in parallel with a low-capacitance diode and unidirectional TVS protection as seen in FIG. 1A. The circuit of FIG. 11, discloses a two (2) terminal device with a unidirectional low capacitance TVS diode 1101 as described in FIG. 9 and an anti-parallel LC PIN or NIP diode 1102. To provide for a low capacitance TVS with a forward conducting low-voltage characteristic, the LC PIN or NIP diode is placed anti-parallel to the unidirectional low capacitance TVS. This LC PIN or NIP diode must also have a reverse blocking voltage greater than the avalanche breakdown p-n junction voltage ($V_{(BR)}$) of the unidirectional TVS.

Figure 12:
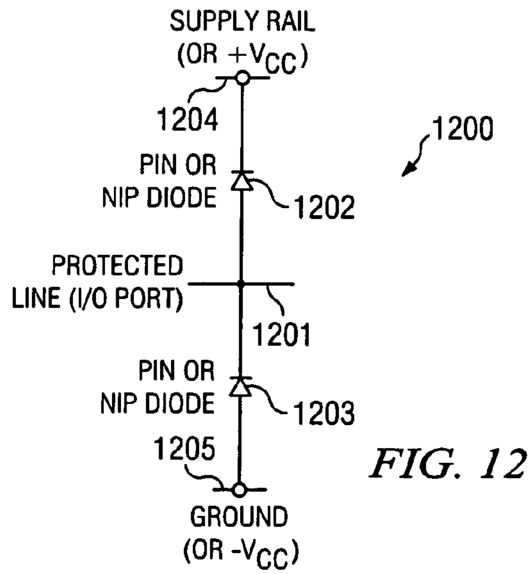
FIG. 12 is a diagram of two low capacitance steering diodes using one PIN or NIP diode from a protected line (I/O port) to $+V_{CC}$ as well as one PIN or NIP diode to ground.

FIG. 12, being another embodiment of the present invention, is a diagram of low capacitance steering diodes 1200 using PIN or NIP diodes 1202, 1203. FIG. 12 illustrates a low capacitance diode arrangement configured as steering diodes to protect a signal line or input/output (I/O) port 1201 from high voltage transients by diverting or directing the transient to either the positive side of the power supply line 1204 or to ground 1205.

Figure 13:
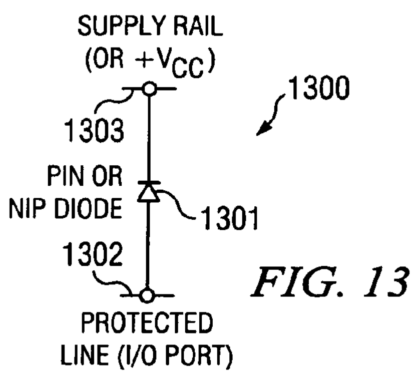
FIG. 13 is a schematic of the steering diode using a PIN or NIP diode from a protected line (I/O port) to $+V_{CC}$.

FIG. 13, being another embodiment of the present invention, is a diagram of a low capacitance steering diode 1300 using a PIN or NIP diode 1301. FIG. 13 illustrates an individual low capacitance PIN or NIP steering diode 1301 to protect a signal line or input/output (I/O) port 1302 from high voltage transients by diverting or directing the transient to the positive side of the power supply 1303.

Figure 14:
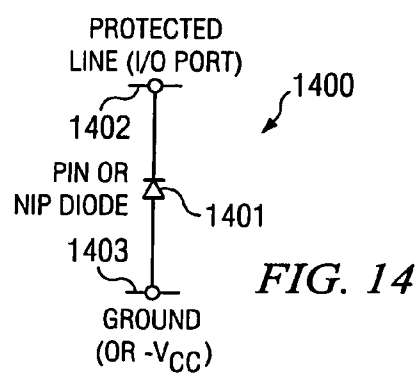
FIG. 14 is a schematic of the steering diode using a PIN or NIP diode from a protected line (I/O port) to ground.

FIG. 14, being another embodiment of the present invention, is a diagram of a low capacitance steering diode 1400 using a PIN or NIP diode 1401. FIG. 14 illustrates an individual low capacitance PIN or NIP steering diode 1401 to protect a signal line or input/output (I/O) port 1402 from high voltage transients by diverting or directing the transient to ground 1403.

The circuit arrangement and method of the present invention can be adapted for use in applications designed to protect sensitive components from high voltage transients where low capacitance, low operating voltages, and/or low insertion loss is required. Such applications include, but are not limited to high frequency telecommunication lines, wireless communications, or any other high baud-rate lines requiring TVS protection. This includes next generation multimedia systems or where new network applications and system designs outpace the present TVS or steering diode component technology needed to support them.

What is claimed is:

1. A bi-directional low capacitance transient voltage suppressor ("TVS") protection circuit, comprising:

a first and second TVS diode;

a first and second low-capacitance ("LC") PIN or NIP diode;

the first TVS diode being placed in series with opposite polarity to the first LC PIN or NIP diode;

the second TVS diode being placed in series with opposite polarity to the second LC PIN or NIP diode; and the frirst series connected TVS diode and LC PIN or NIP diode being arranged parallel, and in the opposite direction, to the second series connected TVS diode and LC PIN or NIP diode.

2. The circuit of claim 1, wherein each of the PIN or NIP diodes have an intrinsic "I" region of high resistivity, a highly doped p region;

an n region; and the "I" region being located between the p region and the n region.

3. The circuit of claim 1, wherein the "I" region of each of the PIN or NIP diodes have a width of between 10 and 500 μm and a resistivity of 250 ohm-cm or higher.

4. The circuit of claim 1, wherein the PIN or NIP diodes have a circular-die structure.

5. The circuit of claim 1, wherein the PIN or NIP diodes have a square die structure.

6. The circuit of claim 1, wherein the PIN or NIP diodes have a rectangular die structure.

7. The circuit of claim 1, adapted to clamp high-voltage transients of either polarity to a predetermined level.

8. The circuit of claim 1, wherein the use of the PIN or NIP diodes are configured to reduce parasitic losses and signal-line distortion.

9. The circuit of claim 1, operable to reduce the complexity of impedance matching within a high frequency circuit.

10. The circuit of claim 1, operable to lower the clamping voltage performance of TVS with capacitances in the range of about 1 pF to 100 pF.

11. The circuit of claim 1, in combination with low parasitic packages operable to reduce capacitances to less than 1 pF.

12. The circuit of claim 1, for use in multiple diode arrays.

13. The circuit of claim 1, further comprising a TVS array packaged in a SOIC-8 package.

14. The circuit of claim 1, further comprising a TVS array packaged in an eight (8) pin dual-in-line package.

15. The circuit of claim 1, further comprising a TVS array packaged in a SOIC-14 package.

16. The circuit of claim 1, further comprising a TVS array packaged in an fourteen (14) pin dual-in-line package.

17. The circuit of claim 1, further comprising a TVS array provided in multiple discrete semiconductor chips.

18. The circuit of claim 1, further comprising a TVS array using multiple diode junctions diffused into a single semiconductor chip or monolithic structure.

19. The circuit of claim 1, further comprising a TVS array packaged with three or more terminals.

20. The circuit of claim 1 adapted for use in high frequency telecommunication lines.

21. The circuit of claim 1 adapted for use in wireless communications devices.

22. The circuit of claim 1 adapted for use in high baud-rate lines requiring TVS protection.

23. The circuit of claim 1 adapted for use in multimedia systems.

24. The circuit of claim 1 adapted for use in network applications and system designs.

* * * * *